United States Patent [19]
Tsujimoto et al.

[11] Patent Number: 5,473,627
[45] Date of Patent: Dec. 5, 1995

[54] UHV ROTATING FLUID DELIVERY SYSTEM

[75] Inventors: Nick Tsujimoto, Morago; Michael Weiss, Danville, both of Calif.

[73] Assignee: MDC Vacuum Products Corporation, Hayward, Calif.

[21] Appl. No.: 93,761

[22] Filed: Sep. 2, 1993

Related U.S. Application Data

[63] Continuation of Ser. No. 972,131, Nov. 5, 1992, abandoned.
[51] Int. Cl.[6] ................................................. H01J 37/305
[52] U.S. Cl. ...................... 373/11; 219/121.15; 118/726
[58] Field of Search .................. 373/11–14; 219/121.15; 118/726, 727, 723

[56] References Cited

U.S. PATENT DOCUMENTS

| | | | |
|---|---|---|---|
| 4,632,059 | 12/1986 | Flatscher et al. | 373/11 |
| 4,748,935 | 6/1988 | Wegmann | 118/723 |
| 4,866,239 | 9/1989 | Egermeier | 373/11 |
| 4,944,245 | 7/1990 | Stoessl et al. | 219/121.15 |
| 4,983,806 | 1/1991 | Harper et al. | 219/121.15 |
| 5,012,064 | 4/1991 | Chang et al. | 373/14 |
| 5,338,913 | 8/1994 | Finn et al. | 373/13 |

*Primary Examiner*—Tu Hoang
*Attorney, Agent, or Firm*—Janet Kaiser Castaneda; James E. Eakin

[57] ABSTRACT

A rotating all metal sealed fluid delivery system for supplying fluid to an apparatus, such as an electron beam source assembly, in an UHV environment includes a housing with fluid inlet and outlet ports therethrough, opposed fluid inlet and outlet lines, an inlet and outlet bellows within the housing, and a turntable mounted in an aperture in the housing for attachment to a rotatable spindle of the apparatus. A ultra high vacuum compression gasket forms an UHV seal between the spindle and the turntable. The bellows are attached at first ends to the inlet and outlet ports, and at opposite ends to the opposed inlet and outlet lines extending to the rotatable apparatus, through the spindle and the turntable into the housing. The bellows are coiled within the housing and separated by a non-abrasive plate. Following attachment to the ports and lines, the entire length of each bellows remains within a single plane during rotation along the same axis as the axis of rotation of the apparatus. As the spindle rotates up to 360°, the oppositely wound bellows are moved along the axis of rotation of the spindle where one coils as the other uncoils, all in the same horizontal plane.

21 Claims, 6 Drawing Sheets

UHV ROTATING FLUID DELIVERY SYSTEM

This is a continuation of U.S. patent application Ser. No. 07/972,131, filed on Nov. 5, 1992, abandoned.

FIELD OF THE INVENTION

The present invention relates to a rotating fluid delivery system for use in an ultra high vacuum (UHV) environment. More particularly, the invention relates to an all metal sealed rotatable bellows for delivering coolant to a rotating multi-crucible electron beam evaporation source assembly in an UHV environment.

BACKGROUND OF THE INVENTION

Rotating assemblies are known in the art for use in high, as opposed to ultra high, vacuum environments. Rotating systems typically include a plurality of crucibles formed in a circular array in the top of a rotating hearth. The rotating hearth sequentially moves the crucibles to a target area where, for instance, an electron beam from an emitter mechanism vaporizes a material in the crucible for thin film deposition on a substrate.

Rotating crucible assemblies typically require a fluid delivery system to supply coolant to water channels formed in the crucible assembly. Prior art fluid delivery systems for rotating apparatus in high vacuum environments generally utilize a rotating apparatus with seals made from elastomeric substances or magnetic fluids placed at the coupling locations to maintain the pressure differential between the ambient coolant supply and the high vacuum environment of the operating apparatus. The elastomeric materials and magnetic fluids provide flexible seals capable of withstanding torsion produced at the coupling locations from rotation of the hearth.

UHV environments, for example those used in physical vapor thin film deposition processes and fabrication processes of integrated circuit semiconductors, require exposure of the assemblies to high temperatures. The elastomeric substances and magnetic fluids used as seals in high vacuum environments cannot be used in an UHV environment for several reasons. First, such substances will not secure an UHV environment; and second, such substances will not withstand high temperatures. UHV environments require all metal sealed fluid delivery systems to prevent outgassing.

All metal sealed fluid delivery systems for UHV environments are known in the art. Such systems typically use a welded bellows with metallic compression seals, and the crucibles are arranged in a linear array because the metal seals cannot withstand torsion produced by rotation. For thin film deposition, for example, the crucibles are sequentially moved past the emitter mechanism using a lengthy, all metal welded bellows assembly. Linear assemblies are typically larger and more cumbersome than the preferred rotating arrangement used in high vacuum environments.

Applicants' co-pending U.S. patent application Ser. No. 07/972,131 discussed a novel UHV, all metal sealed, rotating fluid delivery system for supplying fluid to a rotating assembly operated in an UHV environment. The preferred embodiment utilized an inlet and an outlet bellows coiling together and uncoiling together, in the same plane, in response to rotation of the crucible.

In aspects of the present invention, torque is reduced at the rotating crucible by oppositely winding the inlet and the outlet bellows so that, as the crucible rotates, one bellows uncoils as the other bellows coils. In other aspects of the present invention, a co-axially mounted inlet and outlet bellows pair coils and uncoils in the same direction.

SUMMARY OF THE INVENTION WITH OBJECTS

A general object of the invention is to provide a rotating all metal sealed fluid delivery system for a rotating apparatus in an UHV environment that overcomes limitations and drawbacks of the prior art.

A specific object of the invention is to provide an UHV rotating, all metal sealed fluid delivery system for cooling a plurality of crucibles in a rotary electron beam evaporation source assembly for thin film deposition in an UHV environment.

Yet another specific object of the invention is to provide an UHV all metal sealed fluid delivery system for a rotating apparatus having a bellows assembly with an axis of rotation substantially identical to the axis of rotation of the rotating apparatus.

One more specific object of the invention is to provide a compact, inexpensive, simple all metal sealed rotatable fluid delivery system suitable for operating conditions of $10^{-11}$ Torr and up to 250° Centigrade.

Still another specific object of the invention is to provide an UHV rotating fluid delivery system with a mechanism to maintain separation between an inlet bellows and an outlet bellows to prevent abrasion and entanglement thereof.

Another specific object of the invention is to provide an UHV all metal sealed fluid delivery system wherein the inlet bellows and the outlet bellows are oppositely wound thereby reducing torque at the rotating crucible.

Yet one more specific object of the present invention is to provide a co-axially mounted bellows system wherein an inlet and outlet bellows pair unwinds and winds together in the same direction.

A rotating all metal sealed fluid delivery system for use in an UHV environment includes a cylindrical housing having a fluid inlet port and a fluid outlet port formed in a side wall. An inlet formed bellows and an outlet formed bellows are attached at first ends to, respectively, the inlet and the outlet ports. The bellows are disposed within the cylindrical housing and separated from each other by a plate made from a non-abrasive material. The two bellows are attached at opposite ends to, respectively, opposed ends of an inlet line and an outlet line extending from the rotating apparatus, such as an electron gun assembly. Following attachment to the appropriate port and line, the entire length of each bellows remains within a single plane.

The inlet and outlet lines define substantially 90° bends before passing through openings in a cylindrical torroidal turntable formed in the top planar surface of the housing. The turntable is bolted to the base of a spindle of the rotating apparatus, and a ductile ultra high vacuum compression gasket forms an UHV seal and a water tight seal therebetween As the spindle rotates up to 360°, the bellows are coiled and uncoiled along the axis of rotation of the spindle. Because the bellows are attached to opposed inlets, one bellows coils as the other bellows uncoils, the coiling and uncoiling occurring respectively in the same horizontal plane within the housing.

In another aspect of the present invention, at least one additional bellows pair is provided, and the bellows housing is slightly larger to accommodate two inlet bellows and two opposed outlet bellows.

In yet another aspect of the present invention, one bellows is mounted co-axially inside of the other of a bellows pair, and the inlet and outlet bellows wind and unwind together in the same direction. In this aspect, an additional co-axially mounted bellows pair may be added and the co-axial inlet lines may be opposed to the co-axial outlet lines so that co-axially mounted inlet lines coil as co-axially mounted outlet lines uncoil.

These and other objects, advantages and features of the present invention will become more apparent upon considering the following detailed description of a preferred embodiment, presented in conjunction with the accompanying drawings.

DESCRIPTION OF A PREFERRED EMBODIMENT

Figure 1:
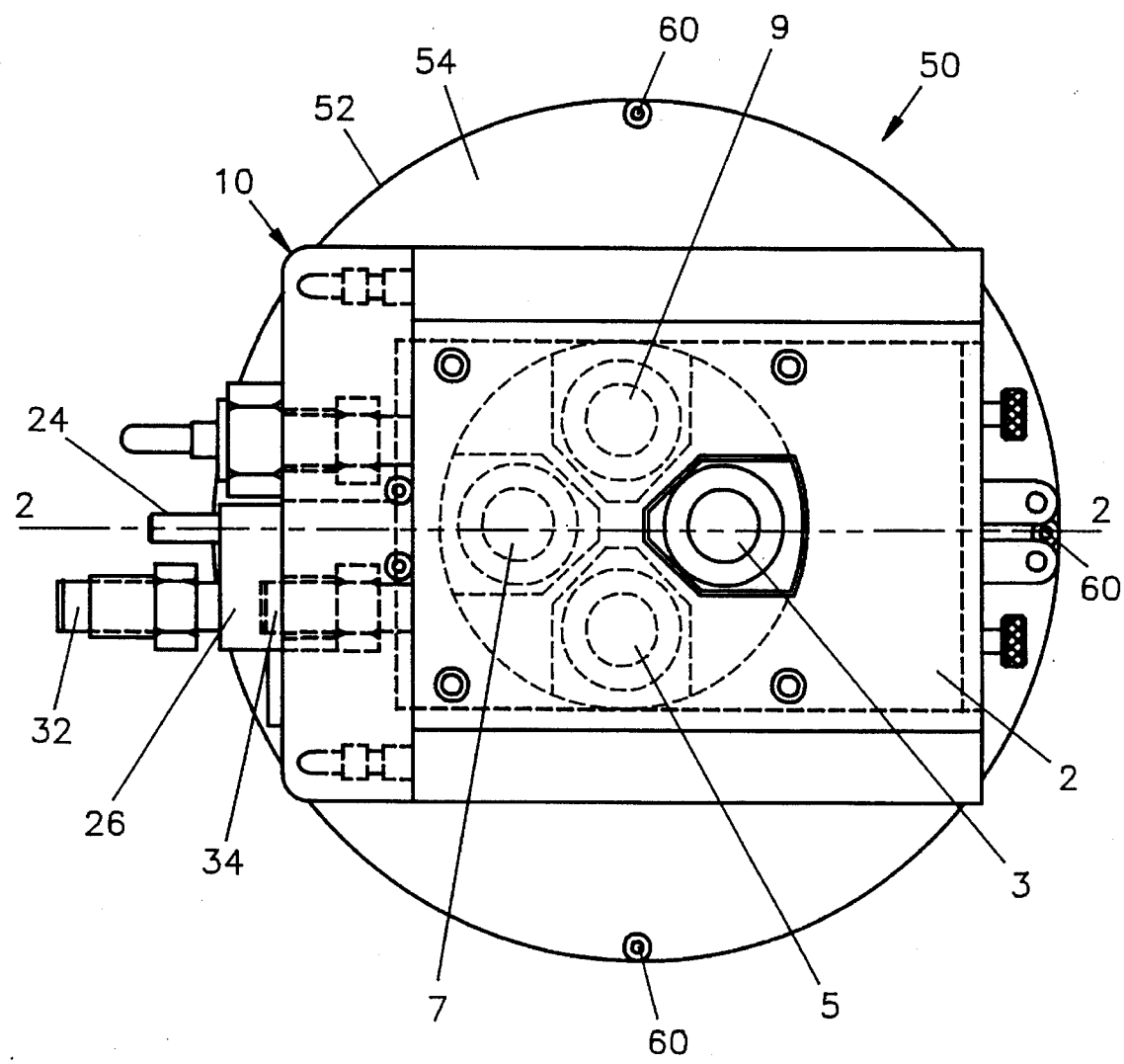
FIG. 1 is a top view of a UHV rotating fluid delivery system embodying the principles of the present invention and shown in use with an electron gun assembly.
Figure 2:
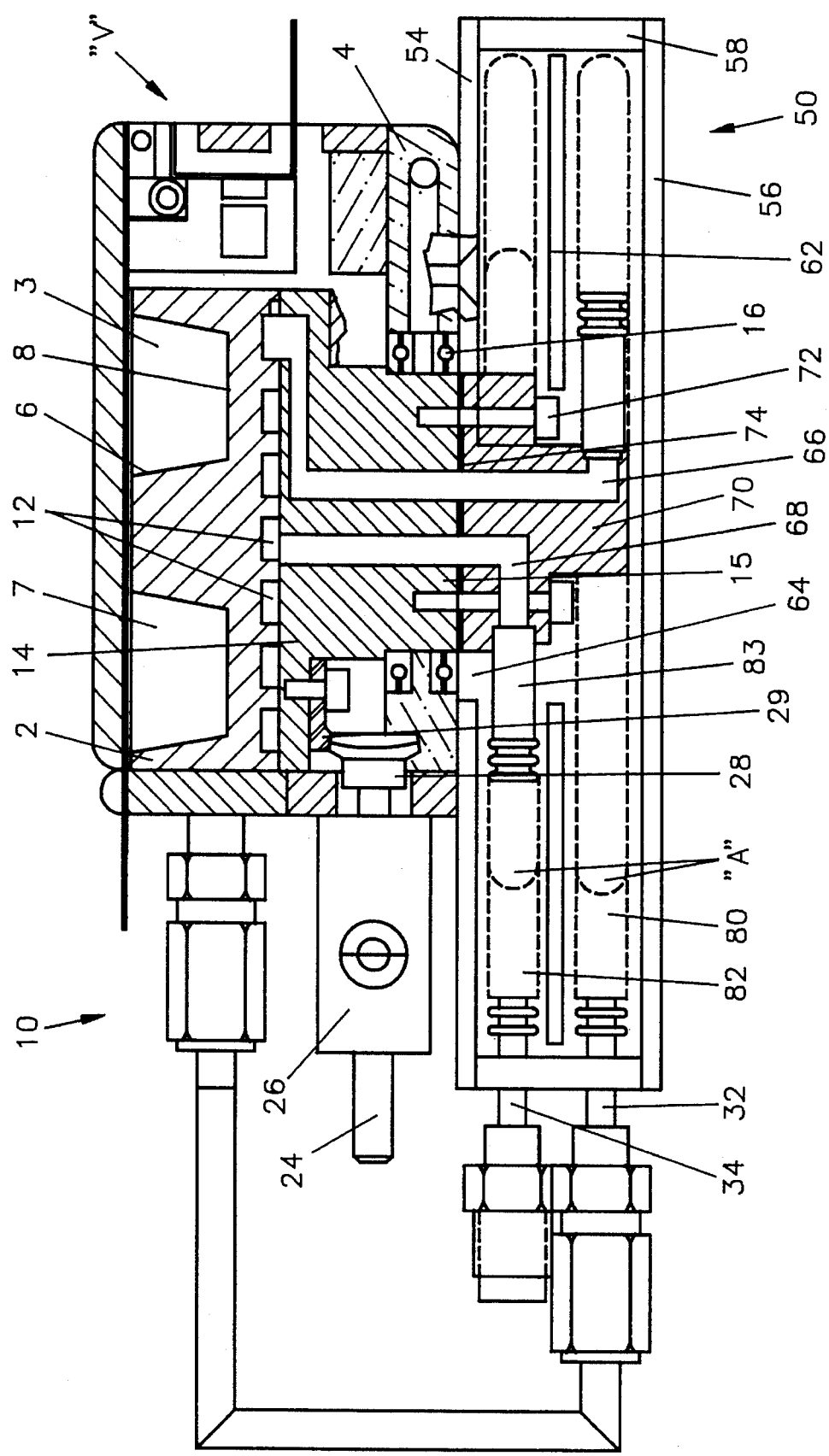
FIG. 2 is a cross sectional view of the system of FIG. 1 taken along lines 2—2.

An UHV rotating fluid delivery system suitable for operation in a UHV environment and embodying the principles of the present invention is shown generally at 50 in FIGS. 1 and 2 providing water to cool an electron gun assembly shown generally at 10. The illustrated electron gun assembly 10 is presented for illustration only and is more fully described in co-pending U.S. patent application Ser. No. 07/972,131 which is hereby incorporated by reference herein. It will be recognized that other electron gun assemblies may be used, and that the fluid delivery system 50 may be used in an UHV environment with any rotating apparatus requiring a supply of circulating fluid.

The illustrated environment includes the following relevant specifications: $10^{-11}$ Torr vacuum and 220° Centigrade temperature, although the fluid delivery system is suitable for temperatures up to 250° Centigrade. The illustrated electron beam source assembly 10 is used for vaporizing materials for thin film deposition on a substrate in a UHV environment. The shielded electron gun mechanism is shown generally at 20 housed in a recess 22 at an end of block 2. The electron gun mechanism and magnetic structure are fully described in co-pending and incorporated U.S. patent application Ser. No. 07/972,131, and are herein presented for illustration only. Other electron gun assemblies may be substituted.

Referring now to FIGS. 1 and 2, the electron beam source assembly 10 defines a generally circular copper block 2 with four, cylindrical copper crucibles 3, 5, 7, and 9 each having frustoconical side walls 6 and a bottom wall 8.

The unitary block 2 further defines a rotating spindle 14, and bearings 16 are provided to journal the spindle 14 within an aperture in a base plate 4. A drive shaft 24 extends from a conventional drive mechanism 26 to conventional mating bevelled gears 28, 29 for rotation of the spindle 14 in a manner well known in the art. The drive mechanism 26 may be placed at the side or back of the assembly 10 as well known in the art.

Multiple conventional water passages 12 are formed in the block 2 for circulation of water, or another suitable coolant. The passages 12 enable the water to spiral around the crucibles.

The UHV rotating fluid delivery system 50 includes fluid inlet and outlet ports, a housing, and a bellows assembly within the housing for delivering fluid to and returning fluid from the electron source assembly 10.

The cylindrical machined, OFHC copper housing defines a planar top wall 54, a planar bottom wall 56, and a stainless steel alloy side wall 58. A plurality of bolts 60 are used to secure the top wall 54 and the bottom wall 56 to the side wall 58. A separation wall 62 made from a non-abrasive material, preferably a soft metal such as copper, is provided between the top wall 54 and the bottom wall 56 in the interior of the housing 52.

Two openings (not shown) are provided in the side wall 58 for receipt of the conventional water source port inlet 32 and the water port outlet 34 to provide water to, and return water from, the channels 12.

The housing 52 further defines a cylindrical flanged annular recess 64 for receipt of a base 15 of the spindle 14. A cylindrical torrodial turntable 70 is mounted within the annular recess 64 for attachment to the base 15 of the spindle 14 by bolts 72. A ductile copper high vacuum gasket 74 is provided between the planar sealing face of the turntable 70 and the base 15 of the spindle 14 to form an UHV sealing arrangement in accordance with principles well known in the art. The copper gasket 74 defines a knife edge (not shown) and provides a seal when squeezed between the base 15 and the turntable 70 to prevent any water from escaping between the UHV joint formed by the turntable 70 and the base 15. It will be recognized by those skilled in the art that other suitable soft metallic substances may be used for the gasket 74.

An inlet water line 66 and an outlet water line 68 extend from the passages 12, through the spindle 14, through mating apertures formed in the base 15 and the turntable 70, and into the housing 52. The water lines 66, 68 define substantially opposed right angle bends for attachment to, respectively, an inlet end of a bellows 80 and an outlet end of a bellows 82 so that the inlet line 66 is oriented at substantially a 180 degree angle from the outlet line 68.

The bellows 80, 82 are stainless steel formed bellows with attachment flanges 83 at each end for attachment to the ports 32, 34 and to the lines 66, 68. When attached to the ports and lines, as shown in FIG. 2, the entire length of the bellows 80, 82, remains within a single plane and within the axis of rotation of spindle 14. The water supply is maintained at ambient "A" within the interior of the bellows 80, 82, separated from the UHV environment "V" within the housing 52 and the electron source assembly 10. A copper separation wall 62 allows the inlet and outlet bellows to operate independently, and the soft copper material of the wall, together with the copper top and bottom walls of the housing, prevents entanglement and abrasion of the bellows 80, 82. The separation wall 62 may be placed vertically within the housing when it is desired to place the bellows side by side. Alternatively, the separation wall 62 may be omitted when a single bellows or a co-axial bellows pair is used.

Figure 3A:
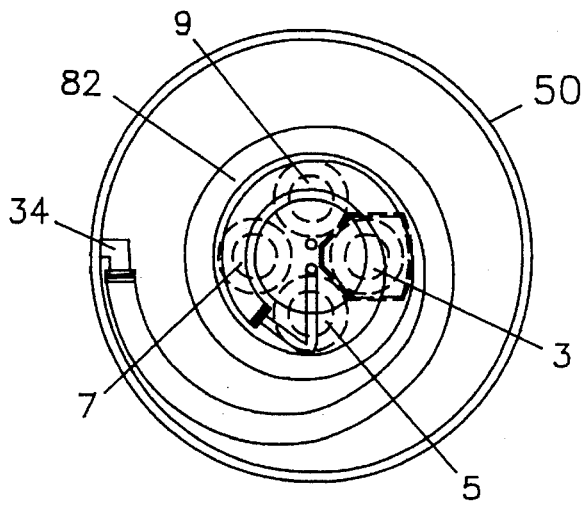
FIGS. 3A, 3B, 3C and 3D are top views of one of the bellows shown with a spindle and crucibles to illustrate the coiled and uncoiled positions thereof as the spindle is rotated 270° from a first through the fourth crucible position.
Figure 3B:
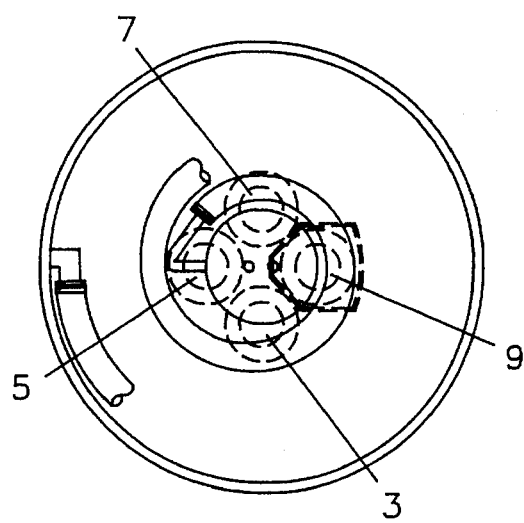
Figure 3C:
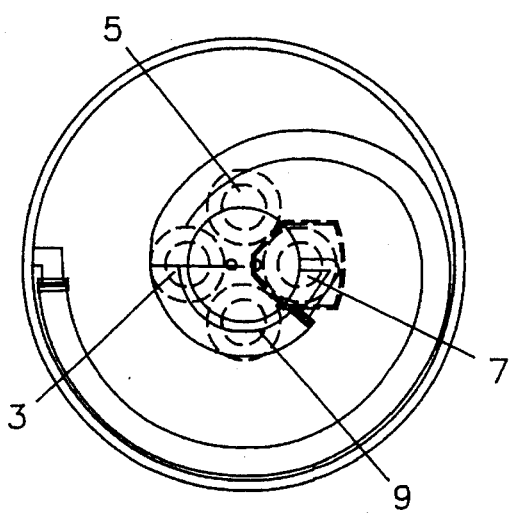
Figure 3D:
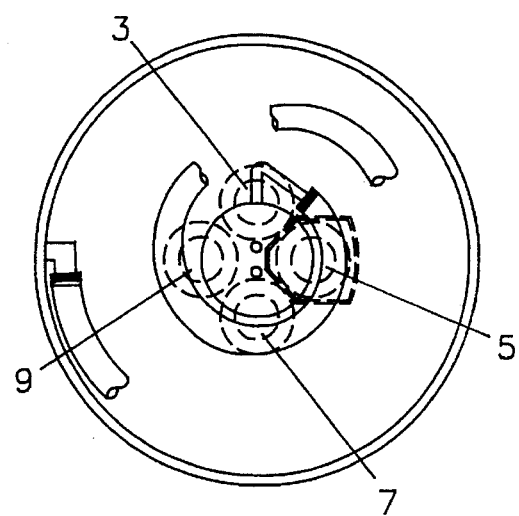

FIGS. 3A through 3D show the position of the upper, outlet bellows 82 as the electron source assembly 10 is rotated to, in turn, position each of the crucibles 3, 5, 7, 9 for bombardment by an electron beam from the emitter assembly 20. In FIG. 3A, the bellows 82 is shown fully coiled when crucible 3 is exposed to the electron beam. FIG. 3B shows crucible 9 rotated into position thereby causing the bellows 82 to begin to uncoil. FIG. 3C shows the further uncoiled position of the bellows 82 as crucible 7 is rotated into position, and FIG. 3D shows the uncoiled position of the bellows 82 with crucible 5 in position for exposure to the electron beam.

Figure 4:
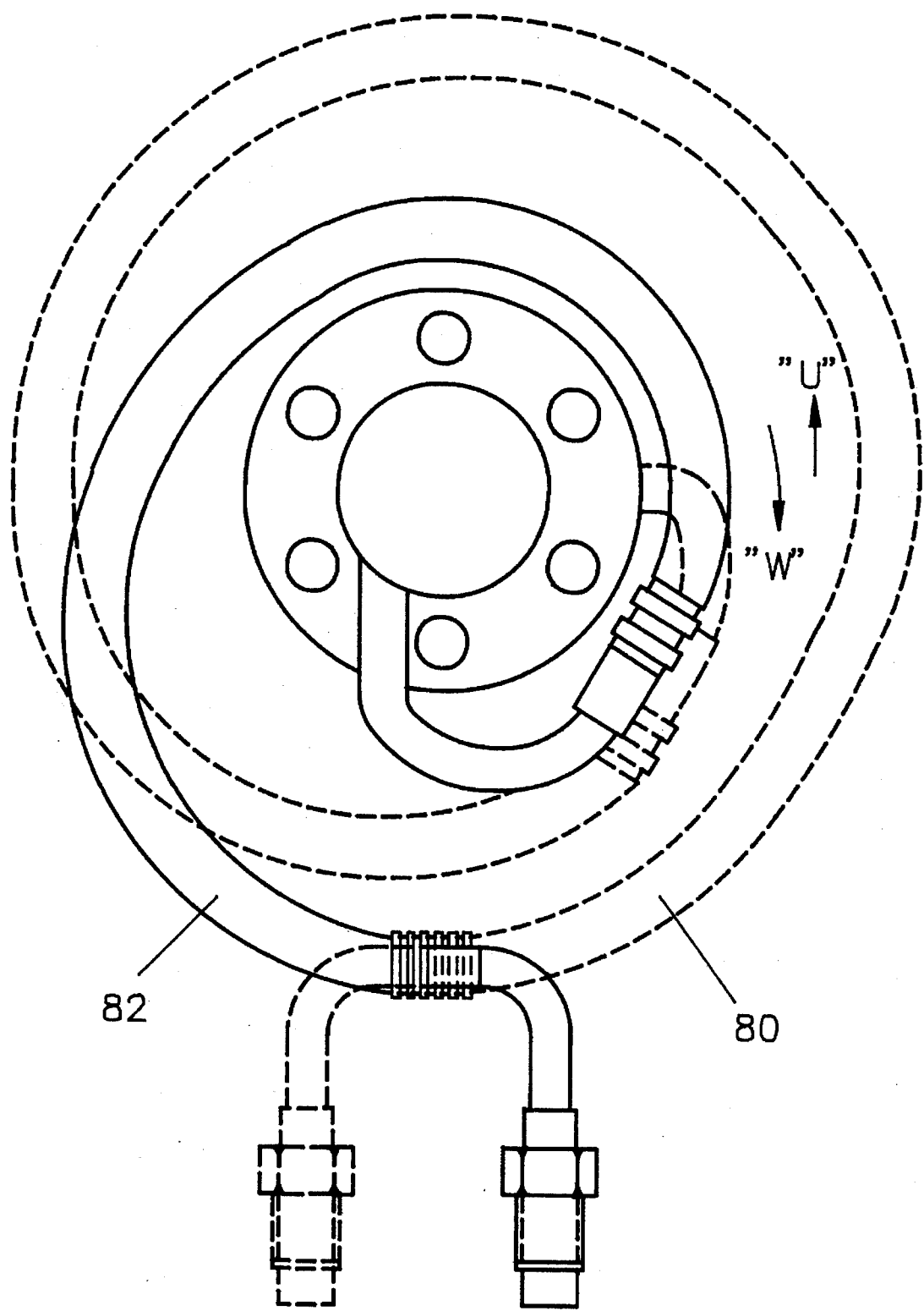
FIG. 4 is a top view of the bellows assembly without the top housing and with the lower bellows in hidden view. The crucible is in fully rotated, the upper bellows is fully coiled, and the lower bellows is fully uncoiled.

Referring now to FIG. 4, the opposed mounting of the bellows 80, 82 may be seen. During assembly of the apparatus, it is preferable to position the spindle in its fully wound position, see direction arrow "W", so that crucible 9 is in the number one position. In this configuration, the lower, inlet bellows 80 is attached in the unwound position shown, and the upper, outlet bellows 82 is attached in its fully wound position. When the electron source assembly 10 is operating, the rotation of the spindle 14 in the oppose direction, see direction arrow "U", causes the bellows 80 to wind and the bellows 82 to unwind, following the rotation of the spindle 14.

FIGS. 3A through 3D illustrate 270° of rotation. Suitable stops (not shown) may be provided to prevent rotation beyond 270°. As can be seen by the drawings, the bellows 80, 82 act as compression springs which coil and uncoil in a single plane as they rotate along the axis of rotation of the spindle 14. The opposed coiling/uncoiling action of the bellows 80, 82 effectively cancels torque produced at the spindle by coiling and uncoiling the bellows. The rotation of the spindle occurs smoothly and evenly. It will be recognized by those skilled in the art that 360° rotation may be achieved with the present system.

Figure 5:
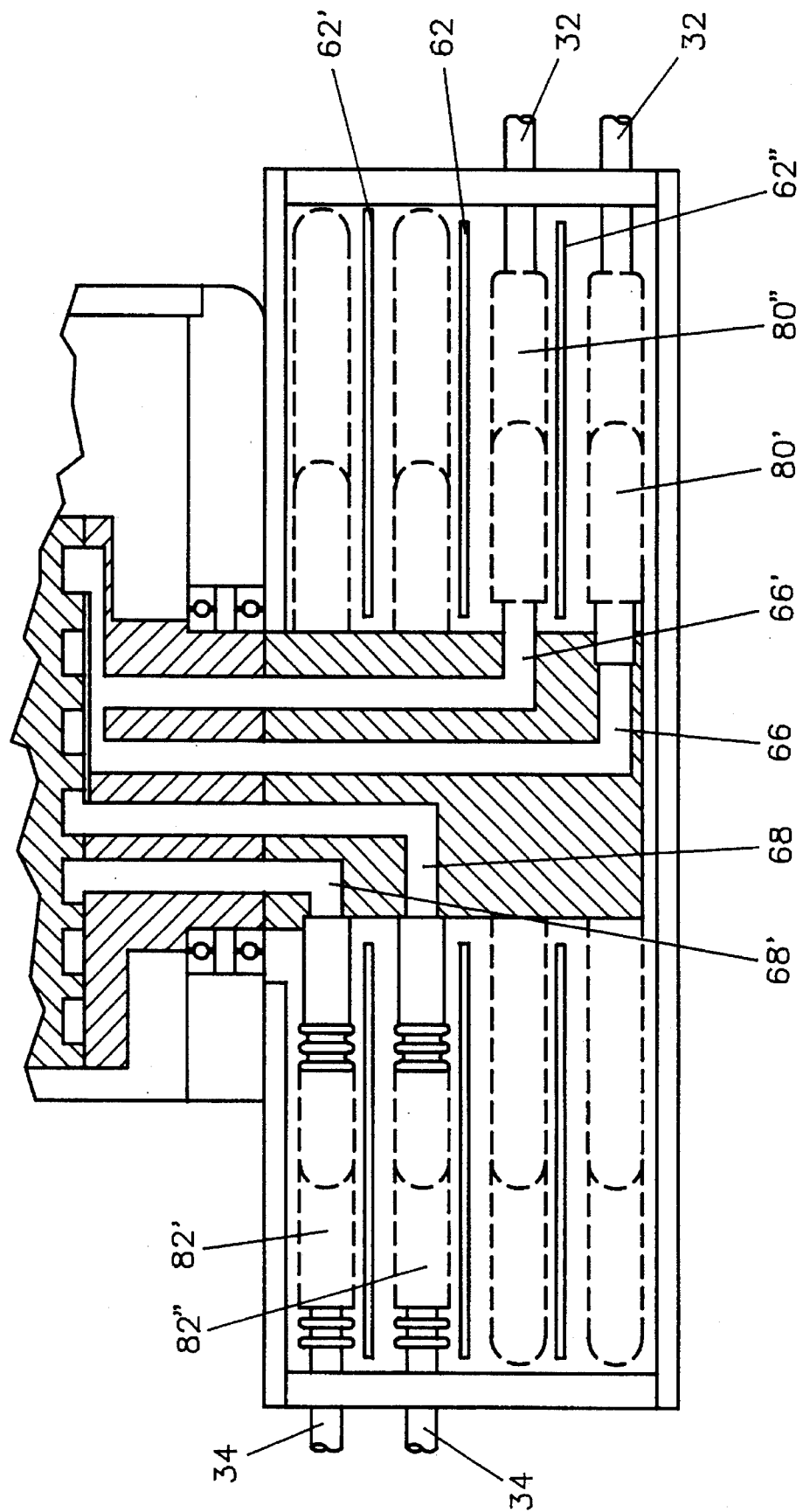
FIG. 5 is a cross sectional view of another aspect of the present invention having two inlet lines, two outlet lines, two inlet bellows and two outlet bellows.

FIG. 5 shows another aspect of the present invention having two pairs of opposed bellows. The housing 52 may be larger to accommodate two inlet bellows 80', 80" and two opposed outlet bellows 82' and 82". In addition to separation wall 62, copper separation walls 62' and 62" are provided to maintain separation between the two inlet bellows 80', 80", and between the two outlet bellows 82', 82". Two inlet lines 66, 66' and ports 32 and two outlet lines 68, 68' and ports 34 are provided for attachment of the two pair of bellows. Alternatively, a second housing may be provided for the second pair of bellows, and a single inlet line and outlet line, each with a divided coupling end for attachment to each pair of bellows, may also be provided.

Figure 6:
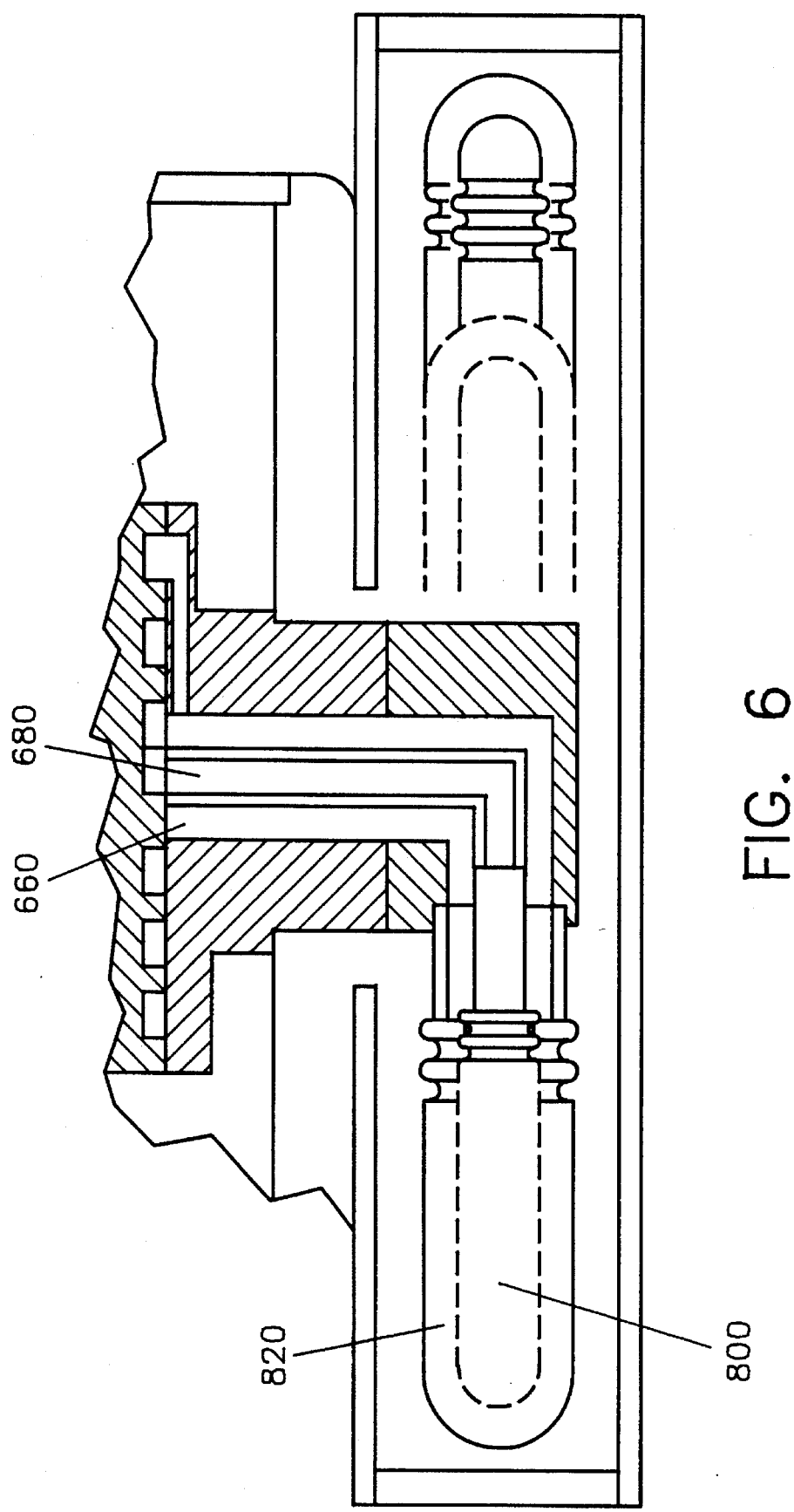
FIG. 6 is a cross sectional view of another aspect of the present invention showing a co-axial bellows arrangement with one bellows mounted inside of the other bellows.

FIG. 6 shows another aspect of the present invention wherein one bellows 800 is mounted co-axially inside of another bellows 820. In this aspect, both bellows wind and unwind together during rotation and the inlet and outlet lines 660, 680 and the inlet and outlet ports are also co-axial. It will be recognized by those skilled in the art that two, co-axial bellows pairs may be provided in which case co-axial inlet lines may be opposed to co-axial outlet lines so that co-axial inlet bellows coil as co-axial outlet bellows uncoil.

To those skilled in the art to which the present invention pertains, many widely varying embodiments and implementations of the principles of the present invention will be suggested from the foregoing. For instance, the rotating fluid delivery system may be used in any high or ultra high vacuum environment utilizing a rotating apparatus requiring a fluid, including a gas, supply. The invention has applications in the semiconductor industry, materials research, for superconductors, and for providing an electron beam source for facilitating production coating of thin solid film onto a substrate, such as coatings for lenses, mirrors, jewelry and other decorative coatings, and automotive coatings. Additionally, the bellows may be arranged in alternative configurations, such as vertically at 90° to the illustrated configuration, as long as the opposed bellows are able to rotate within a substantially single plane that is the same as the axis of rotation of the rotating apparatus to be supplied. Additionally, the bellows housing may be positioned at any point that enables rotation thereof with the axis of the rotating mechanism of the apparatus to be supplied with fluid. The housing may also be permanently mounted by welding, as opposed to bolting it to the spindle of the rotating assembly. The description and the disclosures present herein are by way of illustration only and should not be considered to limit the present invention, the scope of which is more particularly set forth in the following claims.

What is claimed is:

1. A rotatable all metal sealed fluid delivery system for providing fluid to a rotatable apparatus in an ultra high vacuum environ ment comprising:

rotation means adapted for attachment to and rotation with the rotatable apparatus;

at least one pliant inlet and one pliant outlet bellows means operatively attached to the rotation means for rotation therewith;

fluid inlet means attached to the at least one pliant inlet bellows means and adapted to be operatively connected to the rotatable apparatus; and fluid outlet means attached to the at least one pliant outlet bellows means and adapted to be operatively connected to the rotatable apparatus.

2. The all metal sealed fluid delivery system of claim 1 further comprising housing means for the at least one pliant inlet and one outlet bellows means.

3. The all metal sealed fluid delivery system of claim 1 further comprising a ductile seal means for providing a fluid seal and an ultra high vacuum seal between the rotation means and the rotatable apparatus.

4. The all metal sealed fluid delivery system of claim 3 wherein the housing means further comprises an aperture for mounting the rotation means therein.

5. The all metal sealed fluid delivery system of claim 2 wherein the fluid inlet means comprises inlet port means into the housing means for connection to a first end of the at least one pliant inlet bellows means, inlet line means attached to a second end of the at least one pliant inlet bellows means, the inlet port means and inlet line means positioned to enable the pliant inlet bellows means to lay substantially in a single plane when attached thereto.

6. The all metal sealed fluid delivery system of claim 5 wherein the fluid outlet means comprises outlet port means into the housing means for connection to a first end of the at least one pliant outlet bellows means, outlet line means attached to a second end of the at least one pliant outlet bellows means, the outlet port means and outlet line means positioned to enable the at least one pliant outlet bellows means to lay substantially in a single plane when attached thereto.

7. The all metal sealed fluid delivery system of claim 2 wherein the inlet line means and the outlet line means are opposed so that the at least one pliant inlet bellows means coils when the at least one pliant outlet bellows means uncoils in response to up to 360 degree rotation of the rotation means.

8. The all metal sealed fluid delivery system of claim 2 further comprising separation means within the housing means for keeping the at least one pliant inlet and one outlet bellows means separate.

9. The all metal sealed fluid delivery system of claim 2 wherein, during rotation of the rotation means, the at least one pliant inlet bellows means coils within an axis of rotation of the rotation means while the at least one pliant outlet bellows means uncoils within the axis of rotation of the rotation means.

10. The all metal sealed fluid delivery system of claim 5 wherein the inlet line means and the outlet line means are co-axially mounted one within the other and the inlet port means and the outlet port means are co-axially mounted one within the other.

11. The all metal sealed fluid delivery system of claim 6 wherein the at least one pliant inlet and one pliant outlet bellows means comprises at least two inlet bellows and at least two opposed outlet bellows, the inlet line means comprises at least two inlet lines attached to the at least two inlet bellows, and the outlet line means is opposed to the at least two inlet lines and comprises at least two outlet lines attached to the at least two opposed outlet bellows.

12. The all metal sealed fluid delivery system of claim 11 wherein the separation means comprises a first wall between the at least two inlet bellows and the at least two opposed outlet bellows, a second wall between the at least two inlet bellows, and a third wall between the at least two outlet bellows.

13. The all metal sealed fluid delivery system of claim 1 wherein further comprising the apparatus which is an rotary electron beam source assembly having a plurality of crucibles with fluid coolant channels and rotatable up to substantially 360 degrees, the inlet means and outlet means operatively connected to the coolant channels.

14. The all metal sealed fluid delivery system of claim 1 wherein the at least one pliant inlet and one pliant outlet bellows means comprises a first bellows co-axially mounted within a second bellows, the first and second bellows coiling and uncoiling together.

15. The all metal sealed fluid delivery system of claim 1 wherein the at least one pliant inlet and one pliant outlet bellows means comprises at least two inlet bellows mounted co-axially and at least two opposed outlet bellows mounted co-axially, the inlet bellows coiling when the outlet bellows uncoil.

16. The all metal sealed fluid delivery system of claim 15 further comprising separation means within the housing means for keeping the at least two inlet bellows separated from the at least two opposed outlet bellows.

17. A system for delivering fluid in an ultra high vacuum environment, comprising:

a rotatable apparatus defining coolant channels;

inlet and outlet line means operatively attached to the rotatable apparatus for rotation therewith and adapted to be operatively connected to the coolant channels;

fluid inlet and outlet ports; and pliant inlet and outlet connector means connected, respectively, between the fluid inlet ports and the inlet line means and between the fluid outlet ports and outlet line means, the pliant inlet and outlet connector means moving in response to rotation of the rotatable apparatus.

18. An all metal sealed fluid delivery system for providing fluid to coolant channels in a rotatable crucible assembly in an ultra high vacuum environment comprising:

rotating means for attachment to a spindle of the crucible assembly for rotation therewith;

ductile sealing means for forming an ultra high vacuum seal and a fluid seal between the spindle and the rotation means;

housing means having an aperture therein for attachment of the rotating means;

fluid inlet and outlet line means extending from the coolant channels, through the spindle and the rotating means, and to an interior of the housing means;

fluid inlet and outlet port means extending through port apertures in the housing means;

at least one pair of bellows means mounted within the housing means and having first ends coupled to the fluid inlet and outlet line means and second ends coupled to the fluid inlet and outlet port means, during rotation of the rotating means a first of the at least one pair of bellows means coiling within an axis of rotation of the rotating means and a second of the at least one pair of bellows means uncoiling within the axis of rotation of the rotating means.

19. An all metal sealed fluid delivery system for providing fluid to coolant channels in a rotatable crucible assembly in an ultra high vacuum environment comprising:

rotation means for attachment to a spindle of the crucible assembly for rotation therewith;

ductile sealing means for forming an ultra high vacuum seal and a fluid seal between the spindle and the rotation means;

housing means having an aperture therein for attachment of the rotation means;

fluid inlet and outlet line means extending from the coolant channels, through the spindle and the rotation means, and to an interior of the housing means;

fluid inlet and outlet port means extending through port apertures in the housing means;

at least one pair of co-axially mounted bellows means mounted within the housing means and having first ends coupled to the fluid inlet and outlet line means and second ends coupled to the fluid inlet and outlet port means, the co-axially mounted bellows means coiling and uncoiling within an axis of rotation of the rotation means.

20. The all metal sealed fluid delivery system of claim 19 wherein the co-axially mounted bellows means comprises a a first bellows mounted within a second bellows, the first and second bellows attached to a co-axially mounted inlet line and outlet line.

21. The all metal sealed fluid delivery system of claim 19 wherein the co-axially mounted bellows means comprises a pair of co-axially mounted inlet bellows and an opposed pair of co-axially mounted outlet bellows.

* * * * *

UNITED STATES PATENT AND TRADEMARK OFFICE
CERTIFICATE OF CORRECTION

PATENT NO. : 5,473,627
DATED : 5 December 1995
INVENTOR(S) : Nick Tsujimoto and Michael Weiss It is certified that error appears in the above-indentified patent and that said Letters Patent is hereby corrected as shown below:

On the title page, item [75]

".., Morago California;", change to ".., Moraga, California;"

Signed and Sealed this

Fifth Day of March, 1996

Attest:

BRUCE LEHMAN

Attesting Officer            Commissioner of Patents and Trademarks